United States Patent
Larson et al.

(10) Patent No.: US 7,767,385 B2
(45) Date of Patent: Aug. 3, 2010

(54) METHOD FOR LITHOGRAPHY FOR OPTIMIZING PROCESS CONDITIONS

(75) Inventors: Carl E. Larson, San Jose, CA (US); Sharee J. McNab, Huntebury Christchurch (NZ); Steven E. Steen, Peekskill, NY (US); Raman G. Viswanathan, Briarcliff Manor, NY (US); Gregory M. Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 1180 days.

(21) Appl. No.: 11/371,820

(22) Filed: Mar. 9, 2006

(65) Prior Publication Data

US 2007/0212654 A1    Sep. 13, 2007

(51) Int. Cl.
*G03F 7/20* (2006.01)
(52) U.S. Cl. .................. 430/322; 430/312; 430/330; 430/296; 430/394
(58) Field of Classification Search ............... 430/312, 430/394, 330, 322, 296
See application file for complete search history.

(56) References Cited

U.S. PATENT DOCUMENTS

| | | |
|---|---|---|
| 6,171,761 B1 * | 1/2001 | Minamide et al. ........... 430/313 |
| 2002/0119397 A1 * | 8/2002 | Rolfson ...................... 430/312 |
| 2004/0101790 A1 * | 5/2004 | Cauchi et al. ............... 430/394 |
| 2006/0160028 A1 * | 7/2006 | Lee et al. .................... 430/312 |

* cited by examiner

*Primary Examiner*—Kathleen Duda
*Assistant Examiner*—Caleen O Sullivan
(74) *Attorney, Agent, or Firm*—Tutunjian & Bitetto, P.C.; Vazken A. Alexanian

(57) ABSTRACT

A method of lithography is disclosed, which allows for independent resist process optimization of two or more exposure steps that are performed on a single resist layer. By providing for a separate post-exposure bake after each resist exposure step, pattern resolution for each exposure can be optimized. The method can generally be used with different lithographic techniques, and is well-suited for hybrid lithography. It has been applied to the fabrication of a device, in which the active area and the gate levels are defined in separate mask levels using hybrid lithography with an e-beam source and a 248 nm source respectively. Conditions for post-exposure bakes after the two exposure steps are independently adjusted to provide for optimized results.

20 Claims, 1 Drawing Sheet

METHOD FOR LITHOGRAPHY FOR OPTIMIZING PROCESS CONDITIONS

FIELD OF THE INVENTION

The invention relates generally to a method of lithography and more particularly, to a method for optimizing process conditions in lithography with two or more exposure steps in a single mask level.

BACKGROUND OF THE INVENTION

Optical projection lithography is a high resolution technique currently used for defining circuits in the semiconductor industry. As pattern resolution requirements become ever more demanding, conventional optical projection lithography is unable to meet the aggressive resolution targets required for future generation products. Parallel development is underway to enhance traditional optical projection lithography, for example, using immersion schemes, as well as to explore alternative shorter wavelength radiation sources that may provide higher resolution patterning such as extreme ultra-violet (EUV), as well as electron or ion beam based schemes and, to a certain degree, x-ray radiation.

Before advanced manufacturing lithographic tools become widely available, hybrid lithography, i.e., using a combination of different techniques such as optical lithography and direct write electron beam (e-beam) lithography for patterning one mask level, provides a viable approach to fabricate high performance devices, or for Application Specific Integrated Circuits (ASIC's). Direct write e-beam lithography is well established as a high resolution patterning technique with demonstrated resolutions below about 10 nm. However, its throughput is limited due to the serial nature of the patterning and high vacuum requirement. To reduce the write load on the e-beam tool, optical lithography is used to define patterns with less stringent resolution or alignment requirements.

It is desirable to perform both exposures in the same chemical resist layer because the pattern transfer can then be done in a single step. However, the single chemical resist use in the process must be sensitive to both radiation sources, for example, photon and electron exposure. A need exists for an improved method to allow for resist process optimization to achieve desired pattern resolutions in both lithography patterning steps.

SUMMARY OF THE INVENTION

The invention provides a method of lithography that includes at least two exposure steps at a single mask level, and a resist is subjected to a post-exposure bake after each exposure step, with the post-exposure bake temperature at each step being lower than that used in the previous post-exposure bake step.

In one embodiment, the lithographic process comprises providing a resist on a substrate; modifying a first portion of the resist with a first lithographic tool, followed by heating and maintaining the resist at a first temperature for a first time duration; modifying a second portion of the resist with a second lithographic tool, followed by heating and maintaining the resist at a second temperature for a second time duration, with the second temperature being lower than the first temperature; and developing the resist.

Another embodiment provides for a lithographic process, comprising: providing a resist on a substrate; modifying a first portion of the resist with a first lithographic tool, followed by heating and maintaining the resist at a first temperature for a first time duration; modifying a second portion of the resist with a second lithographic tool, followed by heating and maintaining the resist at a second temperature for a second time duration, with the second temperature being lower than the first temperature; where the resist is a poly 4-hydroxystyrene based resist, the first and second lithographic tools each comprises one of an optical radiation source, an electron beam source, ion beam source, extreme ultra-violet source, x-ray source, charged particles source, or a nanoscale tip.

In yet another embodiment, the invention provides for a method of fabricating a device, the method comprises: providing a resist on a substrate; patterning a first portion of the resist with a first lithographic tool to define a first group of device features, followed by heating and maintaining the resist at a first temperature for a first time duration; patterning a second portion of the resist with a second lithographic tool to define a second group of device features, followed by heating and maintaining the resist at a second temperature for a second time duration, the second temperature being lower than the first temperature; and developing the resist; where the first group of device features and the second group of device features are characterized by different critical dimensions.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
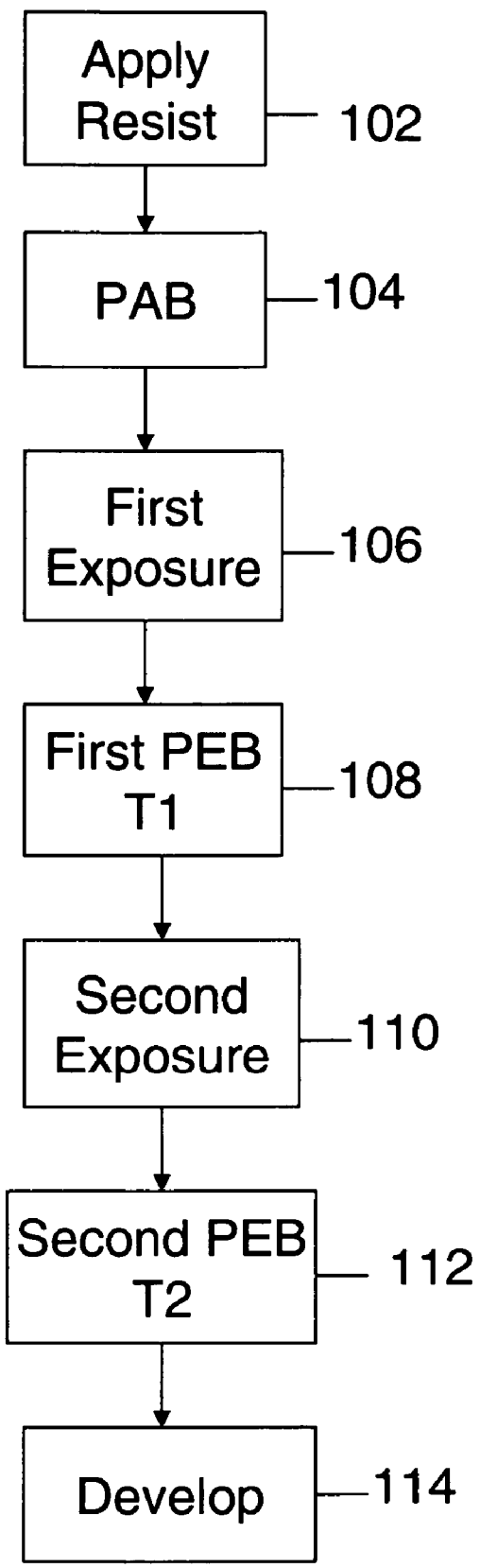
FIG. 1 illustrates a method sequence for lithography according to the present invention.

The present invention relates to a method of lithography, and in particular, a method for optimizing process conditions for lithography that involves a sequential exposure of a single resist layer by one or more radiation sources.

The invention is applicable to hybrid lithography using resists that require a post-exposure bake (PEB), e.g., chemically amplified resists used in semiconductor manufacturing. The post-exposure bake, which is performed after the resist is exposed to certain radiation, provides thermal activation that amplifies the chemical reaction induced by irradiation. The amplification gives rise to the high sensitivity for chemically amplified resists. The present invention provides for a different post-exposure bake for each exposure step, which allows the resist to be processed at different sensitivities. Thus, processing conditions of the resist for each radiation source can be independently optimized.

This process is applicable to lithography involving one or more techniques, including any combinations of optical lithography (e.g., irradiation sources at G-, H- and I-lines: 436, 406 and 365 nm respectively), 248 nm, 193 nm, 157 nm, electron beam lithography, ion beam lithography, extreme ultra-violet lithography (EUV), x-ray, or other forms of lithography such as those based on the use of nanoscale tips, e.g., an atomic force microscope tip. The latter techniques may be based on mechanical or electrostatic effects induced by a nanoscale tip or direct write by charged particles.

Although the process of this invention is well-suited for hybrid lithography, i.e., sequential exposure of one resist layer with two different lithographic tools or techniques, it can also be applied to situations where the same exposure source (or lithographic tool) is used for two or more exposures into the same resist. For the sake of simplicity, the word "exposure" is also used in this discussion to include modification of the resist by a nanoscale tip, even though such a lithographic tool is not usually considered as an exposure tool such as one with a radiation source.

In high performance chip manufacture, for example, optical lithography is routinely used for patterning multiple levels with high resolution. A problem arises, however, when features of varying sizes are patterned in a single exposure step because these features may require different exposure conditions. For example, small diameter openings such as contacts require considerably higher exposure dose than an equivalent line of the same diameter. Optical proximity effect corrections (OPC) are currently used to ameliorate these proximity effects, e.g., in the contact level (CA) for CMOS. For some levels, particularly when working close to the resolution limit, it may be beneficial to separate the patterning into two or more exposure steps, which will allow exposure conditions to be independently optimized. For example, the patterning of some features with larger dimensions may be performed in one exposure step using an appropriate lithographic tool, and the patterning of other features with smaller dimensions or a higher resolution requirement may be performed in another exposure step. The present invention provides for independent bake optimization after each of the exposure steps, allowing for further process improvement.

FIG. 1 illustrates one embodiment, which is herein after called the Triple Bake Process 100. In step 102, a resist is applied to a substrate by any known technique, e.g., spin coating. The resist-coated substrate is subjected to a post-apply bake (PAB) in step 104 at a predetermined temperature that is slightly below the glass transition temperature of the resist. This avoids any resist flow during PAB, and results in the formation of a dense resist film by evaporating off the casting solvent. In step 106, at least a portion of the resist is exposed to a first radiation source from an exposure tool. The choice of the tool and the exposure conditions such as dosage and exposure time depends on the resist chemistry and interaction with the exposing radiation. A first post-exposure bake (PEB) 108 is then performed, in which the substrate is heated and maintained at a predetermined temperature T1 for a time duration that is sufficient for thermal activation and amplification of the exposed portion of the resist. The choice of the PAB and PEB temperatures depends on the specific resist and desired performance characteristics. In general, there is a higher process sensitivity to variations in the PEB temperature T1 (compared to the PAB temperature) because of the chemical amplication process.

A second portion of the resist is then exposed to a second radiation source in step 110. Depending on the specific application, the second radiation source may be the same or different (e.g., in radiation wavelengths or other characteristics) from the one used in the first exposure step 106. A second PEB is then performed on the substrate in step 112 at a temperature T2, which is selected to be lower than temperature T1 used in the first PEB step 108. At this lower temperature T2, the resist operates in a lower sensitivity mode compared to the first PEB in step 108. Note that the PEB in step 112 effectively becomes a second PEB for the first exposed portion of the resist. However, since the PEB temperature T2 is lower than the temperature T1, its effect on the first exposed portion of the resist is reduced because that portion of the resist would be relatively underexposed under this reduced sensitivity condition. The resist is then developed in step 114. It is understood that, in steps 106 and 110 above, the word "exposure" is also used to refer to the treatment of a portion of the resist by a lithographic tool resulting in a modification of the resist properties (e.g., structure, solubility, among others). Suitable lithographic tools include any radiation sources or lasers with various radiation wavelengths, e-beam, ion beam, EUV, x-ray, as well as nanoscale tip-based tools that modify the resist properties through mechanical or electrical effects.

In general, the choice of the PEB temperature also depends on the exposure dose, e.g., a higher exposure dose coupled with a lower PEB temperature may produce similar resolutions or linewidths as a lower exposure dose coupled with a higher PEB temperature. A larger difference between the PEB temperatures T1 and T2 is also preferable so that the different exposed portions of the resist (from the two exposure steps) can operate in as different a sensitivity regime as possible.

Although FIG. 1 illustrates a method involving two exposure steps each with its own PEB, the invention can also be extended to lithographic processes involving more than two exposures each with its corresponding PEB step, as long as each subsequent PEB temperature is lower than temperatures used in previous PEB steps. The selection of which exposure radiation or tool is used in the first and second exposure steps depends on the specific process needs and tool combinations. For example, in one embodiment involving e-beam and optical lithographic tools, it is desirable to operate the resist in a low sensitivity mode for optical exposure in order to achieve resist linearity. On the other hand, since resist non-linearity is not an appreciable problem for e-beam exposure, it is advantageous to operate the resist at a high sensitivity mode for e-beam in order to obtain improved speed and resolution. Therefore, the e-beam tool is used in the first exposure step with a PEB temperature T1, and the optical exposure is performed in the second exposure step with a PEB temperature T2 (lower than T1). The lower temperature T2 effectively disables the chemical amplication of the resist, allowing it to operate in a lower sensitivity mode.

The method of this invention has been demonstrated in the fabrication of a sub-45 nm node SRAM. The process was used to define two layers or mask levels in the device: Active Area, the layer that defines the active areas and the isolation regions for the devices, and Gate Level, the layer that defines the transistor gates. The SRAM cells were fabricated using hybrid lithography in which optical lithography was used to pattern large features in both of these mask levels, e.g., features having critical dimensions larger than about 200 nm, and e-beam lithography was used for patterning other features with critical dimensions less than about 200 nm. As used herein, "critical dimension" refers to the dimension of interest for certain features, and does not necessarily refer to the smallest feature size in a given mask level. In this example, 200 nm was chosen as the reference dimension for dividing the features into the respective groups for e-beam or optical lithography. However, other predetermined values can also be used, as appropriate, for other mask levels, exposure tools or specific application needs.

These two levels were patterned using a 248 nm sensitive e-beam negative resist NEB-31 from Sumitomo with a thickness of about 120 nm, with a post-apply bake at about 100° C. for about 2 minutes. An e-beam exposure of the resist was performed at a dose of about 150 µC. In general, a dose of about 100 µC to about 200 µC can also be used. After e-beam exposure, the resist was baked at about 80° C. for about 1 min. using a vacuum hot plate. The resist was then exposed using an excimer laser at an irradiation wavelength of 248 nm with an exposure dose of 150 mJ/cm$^2$, followed by a second PEB at about 72.5° C. for about 2 mins. In general, a dose in the range of about 100 mJ/cm$^2$ to about 200 mJ/cm$^2$. will also be acceptable. Note that the above exposure doses are provided for illustrative purposes, and may vary according to process conditions.

The two PEB conditions were independently optimized for the e-beam and optical exposures to achieve desired results such as resolution and linearity. The process was found to be relatively sensitive to the PEB temperature after optical exposure, e.g., a variation of about 2.5° C. in the PEB temperature resulted in deterioration of resist linearity or resolution. A larger process margin was observed for the PEB time, but degradation becomes noticeable when the PEB time is increased or decreased by 1 min. That is, acceptable results could be obtained with a PEB temperature of about 70° C. to about 75° C. and a PEB time from about 1 min. to about 3 min. For PEB after e-beam exposure, acceptable results could be obtained at a PEB temperature of about 77.5° C. to about 82.5° C. and a bake time of about 30 sec. to about 90 sec. Lower temperatures tend to result in poor resolution and increased line edge roughness. The resist was then developed in a 0.21 normality tetramethylammonium hydroxide (TMAH) developer for 16 seconds, and conditions for the developing step are adjusted to achieve optimal results from both exposure steps.

Most chemically amplified resists are suitable for use with this invention, as long as they have the required sensitivities to the exposure radiations of interest. Common examples include Rohm and Haas (Shipley) UV2, UV110, UV26 positive resists. Sumitomo NEB, Microtech SU8 and Rohm and Haas UVN30 negative resists. NEB-31 and NEB-22 resists, both available from Sumitomo, are examples of a poly 4-hydroxystyrene (PHS) based resist. Aside from having the required sensitivity to the exposure sources of interest, it is also desirable that the resist has a significant change in sensitivity with post exposure bake temperature.

Having described the foregoing embodiments, it is to be noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

The invention claimed is:

1. A lithographic process, comprising:
   (a) providing a resist on a substrate;
   (b) modifying a first portion of the resist with a first lithographic tool;
   (c) after step (b), heating and maintaining the resist at a first temperature for a first time duration;
   (d) modifying a second portion of the resist with a second lithographic tool;
   (e) after step (d) and prior to any development of the resist, heating and maintaining the resist at a second temperature for a second time duration, the second temperature being lower than the first temperature; and
   (f) developing the resist.

2. The lithographic process of claim 1, further comprising, after step (e), modifying at least a third portion of the resist by one or more lithographic tools, and after each modifying step, heating the resist to a pre-determined temperature that is lower than temperatures used in previous steps.

3. The lithographic process of claim 1, wherein the first and second lithographic tools each comprises one of an optical radiation source, electron beam source, ion beam source, extreme ultra-violet source, x-ray source, charged particles source, or a nanoscale tip.

4. The lithographic process of claim 1, wherein the first lithographic tool is an electron beam source and the second lithographic tool is an optical radiation source.

5. The lithographic process of claim 4, wherein the optical radiation source comprises a radiation wavelength selected from 248 nm, 193 nm, 157 nm, 436 nm, 406 nm or 365 nm.

6. The lithographic process of claim 1, wherein the step (a) comprises applying the resist to the substrate and heating the resist to a temperature below a glass transition temperature of the resist.

7. The lithographic process of claim 1, wherein the resist is a chemically amplified resist.

8. The lithographic process of claim 7, wherein the resist is a poly 4-hydroxystyrene based compound.

9. The lithographic process of claim 8, wherein the first lithographic tool is an e-beam source and the second lithographic tool is an optical radiation source with a radiation wavelength of 248 nm.

10. The lithographic process of claim 8, wherein the first temperature is between about 77.5° C. and about 82.5° C.

11. The lithographic process of claim 8, wherein the second temperature is between about 70° C. and about 75° C.

12. A lithographic process, comprising:
    (a) providing a resist on a substrate;
    (b) modifying a first portion of the resist with a first lithographic tool;
    (c) after step (b), heating and maintaining the resist at a first temperature for a first time duration;
    (d) modifying a second portion of the resist with a second lithographic tool; and
    (e) after step (d) and prior to any development of the resist, heating and maintaining the resist at a second temperature for a second time duration, the second temperature being lower than the first temperature;
    wherein the resist is a poly 4-hydroxystyrene based resist; and the first and second lithographic tools each comprises one of an optical radiation source, an electron beam source, ion beam source, extreme ultra-violet source, x-ray source, charged particles source, or a nanoscale tip.

13. The lithographic process of 12, wherein the first lithographic tool is an electron beam source, and the second lithographic tool is a 248 nm radiation source.

14. A method of fabricating a device, comprising:
    (a) providing a resist on a substrate;
    (b) patterning a first portion of the resist with a first lithographic tool to define a first group of device features;
    (c) after step (b), heating and maintaining the resist at a first temperature for a first time duration;
    (d) patterning a second portion of the resist with a second lithographic tool to define a second group of device features;
    (e) after step (d), heating and maintaining the resist at a second temperature for a second time duration, the second temperature being lower than the first temperature; and
    (f) developing the resist;
    wherein the first group of device features and the second group of device features are characterized by different critical dimensions and are respectively located on mutually exclusive areas of the resist.

15. The method of claim 14, wherein the first lithographic tool and the second lithographic tool each comprises one of an optical radiation source, an electron beam source, ion beam source, extreme ultra-violet source, x-ray source, charged particles source, or a nanoscale tip.

16. The method of claim 15, wherein device features having critical dimensions smaller than a predetermined value are defined in step (b), and device features having critical dimensions larger than the predetermined value are defined in step (d).

17. The method of claim 14, wherein the first lithographic tool is an electron beam source, and the second lithographic tool is a 248 nm radiation source.

18. The method of claim 17, wherein the resist is a poly 4-hydroxystyrene based resist.

19. The method of claim 18, wherein the first temperature is between about 77.5° C. and about 82.5° C.

20. The method of claim 18, wherein the second temperature is between about 70° C. to about 75° C.

* * * * *